United States Patent
Dawood

(10) Patent No.: US 11,025,272 B2
(45) Date of Patent: *Jun. 1, 2021

(54) REAL-TIME HISTORY-BASED BYTE STREAM COMPRESSION

(71) Applicant: Citrix Systems, Inc., Fort Lauderdale, FL (US)

(72) Inventor: Muhammad Dawood, High Wycombe (GB)

(73) Assignee: Citrix Systems, Inc., Fort Lauderdale, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/867,859

(22) Filed: May 6, 2020

(65) Prior Publication Data

US 2021/0013900 A1    Jan. 14, 2021

Related U.S. Application Data

(63) Continuation of application No. 16/507,739, filed on Jul. 10, 2019, now Pat. No. 10,651,871.

(51) Int. Cl.
*H03M 7/34* (2006.01)
*H03M 7/42* (2006.01)
*H03M 7/30* (2006.01)

(52) U.S. Cl.
CPC ........... *H03M 7/42* (2013.01); *H03M 7/3084* (2013.01)

(58) Field of Classification Search
CPC ......... H03M 7/42; H03M 7/3084; H03M 7/00
USPC ...................................................... 341/50, 51
See application file for complete search history.

(56) References Cited

U.S. PATENT DOCUMENTS

| | | | |
|---|---|---|---|
| 5,559,831 A * | 9/1996 | Keith | H03M 7/425 341/106 |
| 7,027,516 B2 | 4/2006 | Anderson et al. | |
| 8,077,061 B2 | 12/2011 | Cameron | |
| 8,127,199 B2 | 2/2012 | Andersson | |
| 8,669,889 B2 * | 3/2014 | Jaquette | H03M 7/40 341/51 |
| 8,949,112 B2 | 2/2015 | Cameron | |

(Continued)

FOREIGN PATENT DOCUMENTS

EP    3 094 001 A1    11/2016

OTHER PUBLICATIONS

Notice of Allowance for U.S. Appl. No. 16/507,739, dated Jan. 13, 2020.

(Continued)

*Primary Examiner* — Jean B Jeanglaude
(74) *Attorney, Agent, or Firm* — Pierce Atwood LLP

(57) ABSTRACT

Systems and methods for stream-based compression include an encoder of a first device that may receive an input stream of bytes including a first byte preceded by one or more second bytes. The encoder may determine to identify a prefix code for the first byte. The encoder may select a prefix code table using the one or more second bytes. The encoder may identify, from the selected prefix code table, the prefix code of the first byte. The encoder may generate an output stream of bytes by replacing the first byte in the input stream with the prefix code of the first byte. The encoder may transmit the output stream from the encoder of the first device to a decoder of a second device. The output stream may have a fewer number of bits than the input stream.

20 Claims, 4 Drawing Sheets

(56) References Cited

U.S. PATENT DOCUMENTS

| | | | |
|---|---|---|---|
| 8,964,831 B2 | 2/2015 | Citta et al. | |
| 9,041,567 B2 * | 5/2015 | Jaquette | H03M 7/30 |
| | | | 341/87 |
| 10,651,871 B1 * | 5/2020 | Dawood | H03M 7/3084 |
| 2008/0033974 A1 | 2/2008 | Cameron | |
| 2011/0280314 A1 | 11/2011 | Sankaran et al. | |
| 2013/0021179 A1 * | 1/2013 | Jaquette | H03M 7/4062 |
| | | | 341/67 |
| 2013/0132453 A1 | 5/2013 | Mitra | |
| 2019/0207624 A1 | 7/2019 | Cassetti et al. | |

OTHER PUBLICATIONS

U.S. Office Action for U.S. Appl. No. 16/507,739, dated Sep. 16, 2019.

Anonymous, "Huffman coding", Wikipedia, May 9, 2019 (May 9, 2019), XP055715734, Retrieved from the Internet: URL: https://en.wikipedia.org/w/index.php?title= Huffmancoding&oldid= 896215156 [retrieved on Jul. 16, 2020].

International Search Report and Written Opinion on International Appl. No. PCT/US2020/031661, dated Jul. 31, 2020.

* cited by examiner

REAL-TIME HISTORY-BASED BYTE STREAM COMPRESSION

CROSS-REFERENCE TO RELATED APPLICATION

This patent application is a continuation of, and claims priority to and the benefit of, U.S. patent application Ser. No. 16/507,739, titled "REAL-TIME HISTORY-BASED BYTE STREAM COMPRESSION," and filed Jul. 10, 2019, the contents of all of which are hereby incorporated herein by reference in its entirety for all purposes.

FIELD OF THE DISCLOSURE

The present application generally relates to compression, including but not limited to systems and methods for stream-based compression using real-time history buffers and prefix code computation.

BACKGROUND

In a computing environment in which multiple computing devices are connected, one device may request, download, or otherwise retrieve data from a second device. In some implementations, the second device may compress the data prior to transmitting, sending, communicating, or otherwise providing the data to the first device. The second device may compress the data to conserve network bandwidth. The first device may receive the data and decompress the data.

SUMMARY

This Summary is provided to introduce a selection of concepts in a simplified form that are further described below in the Detailed Description. This Summary is not intended to identify key features or essential features, nor is it intended to limit the scope of the claims included herewith.

The following disclosure is directed to systems and methods for real-time history-based byte stream compression with mirrored encoder decoder context-based Huffman symbol code computation. Various versions of stream-based compression may be used to reduce bandwidth consumption and improve responsiveness. Stream-based compression may be applied at the point when the protocol is being multiplexed into a single stream, and is also known as "bulk compression." Such compression protocols may be embodied on a system, device, or component referred to as a "reducer," or an "encoder." The reducer may operate by maintaining an arbitrarily-sized circular history buffer of previously seen bytes. The reducer may attempt to efficiently locate previous occurrences of new incoming data within the history buffer. Where a matching set of bytes is found, the reducer need not emit the set of bytes. Rather, the reducer may output a code or identifier indicating a match and the (unbounded) length, l, of the match. Upon receiving this code, the decoder can copy the length (l) of bytes from its history buffer, recreating the new data, and the process continues.

In various implementations of the present disclosure, an encoder may receive an input stream of bytes including a first byte preceded by one or more second bytes. The encoder may determine to identify a prefix code for the first byte. The encoder may select, from a plurality of prefix code tables maintained by the encoder, a prefix code table using the one or more second bytes. Each prefix code table of the plurality of prefix code tables may include respective prefix codes for respective bytes. Each prefix code may include a number of bits based on a frequency of occurrence of the one or more second bytes preceding the respective byte. The encoder may-identify, from the selected prefix code table, the prefix code of the first byte. The encoder may generate an output stream of bytes by replacing the first byte in the input stream with the prefix code of the first byte. The encoder may transmit the output stream from the encoder to a decoder, with the output stream having a fewer number of bits than the input stream.

According to the embodiments of the technical solution described herein, the encoder may compress a byte stream by backwards-referencing an arbitrarily sized circular history buffer of previously seen bytes using an elaborate hashing scheme for purposes of speed. The encoder may encode unmatched data using context-specific prefix (e.g., Huffman symbol) codes. The system may avoid the need to transmit prefix tables by having the decoder mirror the encoder prefix code computation. The encoder may use an elaborate hashing scheme is used to find occurrences of new bytes in previously seen bytes of the encoder's history buffer with greater accuracy than previously achieved. The encoder may provide, transmit, or otherwise emit match length codes as prefix codes. The prefix codes may be computed by both encoder and the decoder (sender/receiver) to avoid the need to send whole or partial prefix tables, thereby reducing the number of bits required to encode new data. The prefix codes may be context-specific such that multiple prefix codes are generated for each symbol with the transmitted code being determined by some stream specific context.

In one aspect, this disclosure is directed to a method of stream-based compression. The method may include receiving, by an encoder of a first device, an input stream of bytes including a first byte preceded by one or more second bytes. The method may include determining, by the encoder, to identify a prefix code for the first byte. The method may include selecting, by the encoder from a plurality of prefix code tables maintained by the encoder, a prefix code table using the one or more second bytes. Each prefix code table of the plurality of prefix code tables may include respective prefix codes for respective bytes. Each prefix code may include a number of bits based on a frequency of occurrence of the one or more second bytes preceding the respective byte. The method may include identifying, by the encoder, from the selected prefix code table, the prefix code of the first byte. The method may include generating, by the encoder, an output stream of bytes by replacing the first byte in the input stream with the prefix code of the first byte. The method may include transmitting the output stream from the encoder of the first device to a decoder of a second device. The output stream may have a fewer number of bits than the input stream.

In some embodiments, transmitting the output stream includes transmitting the output stream to the decoder of the second device. The decoder may be configured to decode the output stream using a plurality of prefix code tables corresponding to the plurality of prefix code tables maintained by the encoder. In some embodiments, determining to identify the prefix code for the first byte includes generating, by the encoder, from the input stream, a hash value based on the first byte and a number of preceding bytes, performing, by the encoder using the hash value, a lookup in a buffer comprising a plurality of hashes, and determining that the buffer does not include a matching string.

In some embodiments, the method further includes identifying, by the encoder, a third byte in the input stream. The method may further include generating, by the encoder, from the input stream, a hash value based on the third byte and a number of preceding bytes. The method may further include performing, by the encoder using the hash value, a lookup in a buffer comprising a plurality of hash values to identify a matching hash value. The method may further include generating, by the encoder responsive to identifying the matching hash value in the buffer, an identifier indicating a presence of the matching hash value within the buffer. In some embodiments, generating the output stream further includes generating, by the encoder, the output stream of bytes by replacing the third byte and the number of preceding bytes in the input stream with the identifier and a length. In some embodiments, a length is limited to a length of a maximum number of bits of the respective prefix codes for the plurality of prefix code tables. In some embodiments, the method further includes determining, by the encoder, the length of bytes corresponding to the matching hash value, and identifying, by the encoder, in a length prefix code table corresponding to the identifier, a prefix code corresponding to the length of bytes. Generating the output stream may further include generating, by the encoder, the output stream of bytes by replacing the third byte and the number of preceding bytes in the input stream with the identifier and the prefix code corresponding to the length of bytes.

In some embodiments, the input stream includes a stream of input bytes. The plurality of prefix code tables may include a respective prefix code table for each possible input byte. In some embodiments, the method includes maintaining, by the encoder, each of the plurality of prefix code tables indexed by one or more respective bytes. Selecting the prefix code table may include performing, by the encoder, a look-up of the plurality of prefix code tables using the one or more second bytes to identify the prefix code table. In some embodiments, the plurality of prefix code tables is a first plurality of prefix code tables and the input stream is a first input stream. The plurality of prefix code tables may be generated based on the first input stream. The method may include receiving, by the encoder, a second input stream comprising a plurality of second bytes. The method may include, for at least some of the second bytes of the second input stream, identifying, by the encoder, a respective prefix code table using at least one preceding byte of the second input stream which precedes the second byte. The method may include identifying, by the encoder, from the respective prefix code table, a prefix code corresponding to the second byte. The method may include updating, by the encoder, a count of the prefix code corresponding to the second byte. The method may include generating, by the encoder, a second plurality of prefix code tables based on the count of each respective prefix code in each respective prefix code table in the first plurality of prefix code tables.

In some embodiments, the method further includes maintaining, by the decoder, the first plurality of prefix code tables. The method may include receiving, by the decoder from the encoder, a second output stream corresponding to the second input stream. The second output string may include a plurality of prefix codes. The method may include, for each prefix code of the plurality of prefix codes, identifying, by the decoder, a corresponding input byte within a prefix code table of the first plurality of prefix code tables corresponding to a preceding byte of the respective prefix code. The method may include updating, by the decoder, a count of the corresponding input byte within the prefix code table. The method may include generating, by the encoder, a second plurality of prefix code tables based on the count of each respective input byte in each respective prefix code table in the first plurality of prefix code tables.

In some embodiments, the method further includes identifying a third byte in the input stream. The method may include generating, by the encoder, from the input stream, a string including the third byte and a plurality of preceding bytes. The method may include computing, by the encoder, a hash value for the string. The method may include performing, by the encoder, a lookup of the hash value in a hash table comprising a plurality of hash values corresponding to respective strings. In some embodiments, the string is a first string comprising the third byte and a first plurality of preceding byes, the hash is a first hash, and the hash table is a first hash table including a plurality of first hash values. The method may further include generating, by the encoder responsive to not identifying a matching first hash value of the first hash table, a second string comprising the third byte and a second plurality of preceding bytes less than the first plurality of preceding bytes. The method may include computing, by the encoder, a second hash value for the second string. The method may include performing, by the encoder, a lookup of the second hash value in a second hash table comprising a plurality of second hash values corresponding to respective strings. The method may include identifying, by the encoder, a matching second hash value of the second hash table.

In some embodiments, generating the output stream further includes generating, by the encoder, the output stream of bytes by replacing the third byte and the second plurality of preceding bytes with the identifier and a length. In some embodiments, the method includes receiving, by the decoder from the encoder, the output stream. The output stream may include at least one prefix code. The method may include identifying, by the decoder, the prefix code in the output stream. The method may include identifying, by the decoder, at least one preceding byte which precedes the prefix code. The method may include selecting, by the decoder, from a plurality of prefix code tables maintained by the decoder, a prefix code table corresponding to the at least one preceding byte. The method may include identifying, by the decoder, an input byte corresponding to the prefix code by performing a lookup of the prefix code in the selected prefix code table. The method may include reproducing, by the decoder, the input stream by replacing the prefix code in the output stream with the input byte.

In another respect, this disclosure is directed to a system for stream-based compression. The system includes a first device including an encoder. The encoder may be configured to receive an input stream of bytes including a first byte preceded by one or more second bytes. The encoder may be configured to determine to identify a prefix code for the first byte. The encoder may be configured to select, from a plurality of prefix code tables maintained by the encoder, a prefix code table using the one or more second bytes. Each prefix code table of the plurality of prefix code tables may include respective prefix codes for respective bytes. Each prefix code may include a number of bits based on a frequency of occurrence of the one or more second bytes preceding the respective byte. The encoder may be configured to identify, from the selected prefix code table, the prefix code of the first byte. The encoder may be configured to generate an output stream of bytes by replacing the first byte in the input stream with the prefix code of the first byte. The first device may be configured to transmit the output stream from the encoder of the first device to a decoder of a second device, the output stream having a fewer number of bits than the input stream.

In some embodiments, the first device is configured to transmit the output stream to the decoder of the second device. The decoder may be configured to decode the output stream using a plurality of prefix code tables corresponding to the plurality of prefix code tables maintained by the encoder. In some embodiments, the encoder is further configured to generate, from the input stream, a hash based on the first byte and a number of preceding bytes. The encoder may be configured to perform a lookup in a buffer using the hash, the buffer comprising a plurality of hashes. The encoder may be configured to determine that the buffer does not include a matching string. In some embodiments, the encoder is further configured to identify a third byte in the input stream. The encoder may be configured to generate, from the input stream, a hash based on the third byte and a number of preceding bytes. The encoder may be configured to perform, by the encoder, a lookup in a buffer using the string to identify a matching hash. The buffer may include a plurality of hashes. The encoder may be configured to generate, responsive to identifying the matching hash in the buffer, an identifier indicating a presence of the matching hash within the buffer. In some embodiments, generating the output stream further includes generating, by the encoder, the output stream of bytes by replacing the third byte and the number of preceding bytes in the input stream with the identifier and a length.

BRIEF DESCRIPTION OF THE DRAWING FIGURES

Objects, aspects, features, and advantages of embodiments disclosed herein will become more fully apparent from the following detailed description, the appended claims, and the accompanying drawing figures in which like reference numerals identify similar or identical elements. Reference numerals that are introduced in the specification in association with a drawing figure may be repeated in one or more subsequent figures without additional description in the specification in order to provide context for other features, and not every element may be labeled in every figure. The drawing figures are not necessarily to scale, emphasis instead being placed upon illustrating embodiments, principles and concepts. The drawings are not intended to limit the scope of the claims included herewith.

DETAILED DESCRIPTION

For purposes of reading the description of the various embodiments below, the following descriptions of the sections of the specification and their respective contents may be helpful:

Section A describes a computing environment which may be useful for practicing embodiments described herein.

Section B describes systems and methods for stream-based compression.

A. Computing Environment

Prior to discussing the specifics of embodiments of the systems and methods detailed herein in Section B, it may be helpful to discuss the computing environments in which such embodiments may be deployed.

Figure 1:
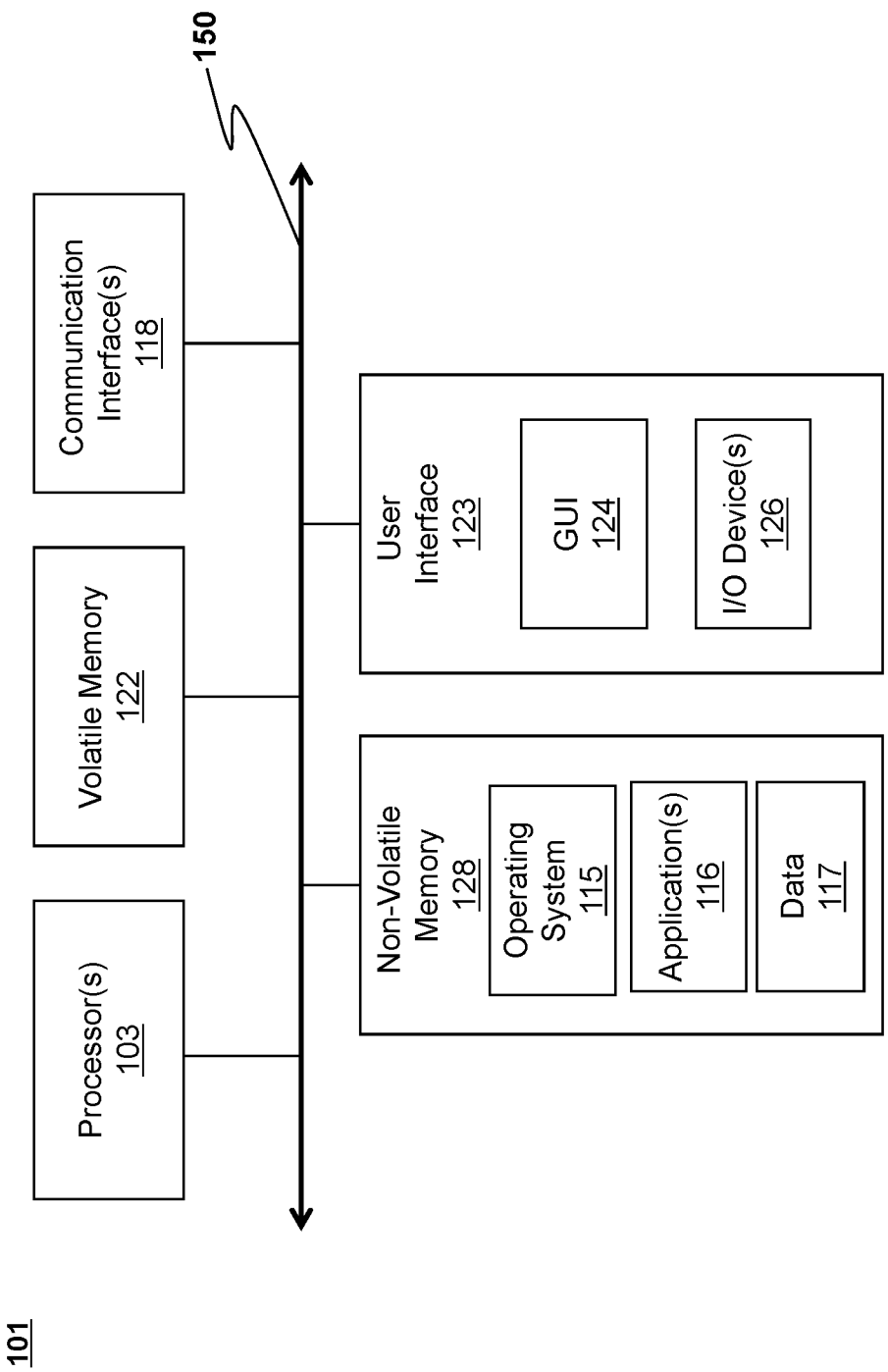
FIG. 1 is a block diagram of a network computing system, in accordance with an illustrative embodiment.

As shown in FIG. 1, computer 101 may include one or more processors 103, volatile memory 122 (e.g., random access memory (RAM)), non-volatile memory 128 (e.g., one or more hard disk drives (HDDs) or other magnetic or optical storage media, one or more solid state drives (SSDs) such as a flash drive or other solid state storage media, one or more hybrid magnetic and solid state drives, and/or one or more virtual storage volumes, such as a cloud storage, or a combination of such physical storage volumes and virtual storage volumes or arrays thereof), user interface (UI) 123, one or more communications interfaces 118, and communication bus 150. User interface 123 may include graphical user interface (GUI) 124 (e.g., a touchscreen, a display, etc.) and one or more input/output (I/O) devices 126 (e.g., a mouse, a keyboard, a microphone, one or more speakers, one or more cameras, one or more biometric scanners, one or more environmental sensors, one or more accelerometers, etc.). Non-volatile memory 128 stores operating system 115, one or more applications 116, and data 117 such that, for example, computer instructions of operating system 115 and/or applications 116 are executed by processor(s) 103 out of volatile memory 122. In some embodiments, volatile memory 122 may include one or more types of RAM and/or a cache memory that may offer a faster response time than a main memory. Data may be entered using an input device of GUI 124 or received from I/O device(s) 126. Various elements of computer 101 may communicate via one or more communication buses, shown as communication bus 150.

Computer 101 as shown in FIG. 1 is shown merely as an example, as clients, servers, intermediary and other networking devices and may be implemented by any computing or processing environment and with any type of machine or set of machines that may have suitable hardware and/or software capable of operating as described herein. Processor(s) 103 may be implemented by one or more programmable processors to execute one or more executable instructions, such as a computer program, to perform the functions of the system. As used herein, the term "processor" describes circuitry that performs a function, an operation, or a sequence of operations. The function, operation, or sequence of operations may be hard coded into the circuitry or soft coded by way of instructions held in a memory device and executed by the circuitry. A "processor" may perform the function, operation, or sequence of operations using digital values and/or using analog signals. In some embodiments, the "processor" can be embodied in one or more application specific integrated circuits (ASICs), microprocessors, digital signal processors (DSPs), graphics processing units (GPUs), microcontrollers, field programmable gate arrays (FPGAs), programmable logic arrays (PLAs), multi-core processors, or general-purpose computers with associated memory. The "processor" may be analog, digital or mixed-signal. In some embodiments, the "processor" may be one or more physical processors or one or more "virtual" (e.g., remotely located or "cloud") processors. A processor including multiple processor cores and/or multiple processors multiple processors may provide functionality for parallel, simultaneous execution of instructions or for parallel, simultaneous execution of one instruction on more than one piece of data.

Communications interfaces 118 may include one or more interfaces to enable computer 101 to access a computer network such as a Local Area Network (LAN), a Wide Area Network (WAN), a Personal Area Network (PAN), or the Internet through a variety of wired and/or wireless or cellular connections.

In described embodiments, the computing device 101 may execute an application on behalf of a user of a client computing device. For example, the computing device 101 may execute a virtual machine, which provides an execution session within which applications execute on behalf of a user or a client computing device, such as a hosted desktop session. The computing device 101 may also execute a terminal services session to provide a hosted desktop environment. The computing device 101 may provide access to a computing environment including one or more of: one or more applications, one or more desktop applications, and one or more desktop sessions in which one or more applications may execute.

B. Systems and Methods for Stream-Based Compression

The following disclosure is directed to systems and methods for real-time history-based byte stream compression with mirrored encoder decoder context-based Huffman symbol code computation. Various versions of stream-based compression may be used to reduce bandwidth consumption and improve responsiveness. Stream-based compression may be applied at the point when the protocol is being multiplexed into a single stream, and is also known as "bulk compression." Such compression protocols may be embodied on a system, device, or component referred to as a "reducer," or an "encoder." The reducer may operate by maintaining an arbitrarily-sized circular history buffer of previously seen bytes. The reducer may attempt to efficiently locate previous occurrences of new incoming data within the history buffer. Where a matching set of bytes is found, the reducer need not emit the set of bytes. Rather, the reducer may output a code or identifier indicating a match and the (unbounded) length, l, of the match. Upon receiving this code, the decoder can copy the length (l) of bytes from its history buffer, recreating the new data, and the process continues.

In various implementations of the present disclosure, an encoder may receive an input stream of bytes including a first byte preceded by one or more second bytes. The encoder may determine to identify a prefix code for the first byte. The encoder may select, from a plurality of prefix code tables maintained by the encoder, a prefix code table using the one or more second bytes. Each prefix code table of the plurality of prefix code tables may include respective prefix codes for respective bytes. Each prefix code may include a number of bits based on a frequency of occurrence of the one or more second bytes preceding the respective byte. The encoder may-identify, from the selected prefix code table, the prefix code of the first byte. The encoder may generate an output stream of bytes by replacing the first byte in the input stream with the prefix code of the first byte. The encoder may transmit the output stream from the encoder to a decoder, with the output stream having a fewer number of bits than the input stream.

According to the embodiments of the technical solution described herein, the encoder may compress a byte stream by backwards-referencing an arbitrarily sized circular history buffer of previously seen bytes using an elaborate hashing scheme for purposes of speed. The encoder may encode unmatched data using context-specific prefix (e.g., Huffman symbol) codes. The system may avoid the need to transmit prefix tables by having the decoder mirror the encoder prefix code computation. The encoder may use an elaborate hashing scheme is used to find occurrences of new bytes in previously seen bytes of the encoder's history buffer with greater accuracy than previously achieved. The encoder may provide, transmit, or otherwise emit match length codes as prefix codes. The prefix codes may be computed by both encoder and the decoder (sender/receiver) to avoid the need to send whole or partial prefix tables, thereby reducing the number of bits required to encode new data. The prefix codes may be context-specific such that multiple prefix codes are generated for each symbol with the transmitted code being determined by some stream specific context.

Figure 2:
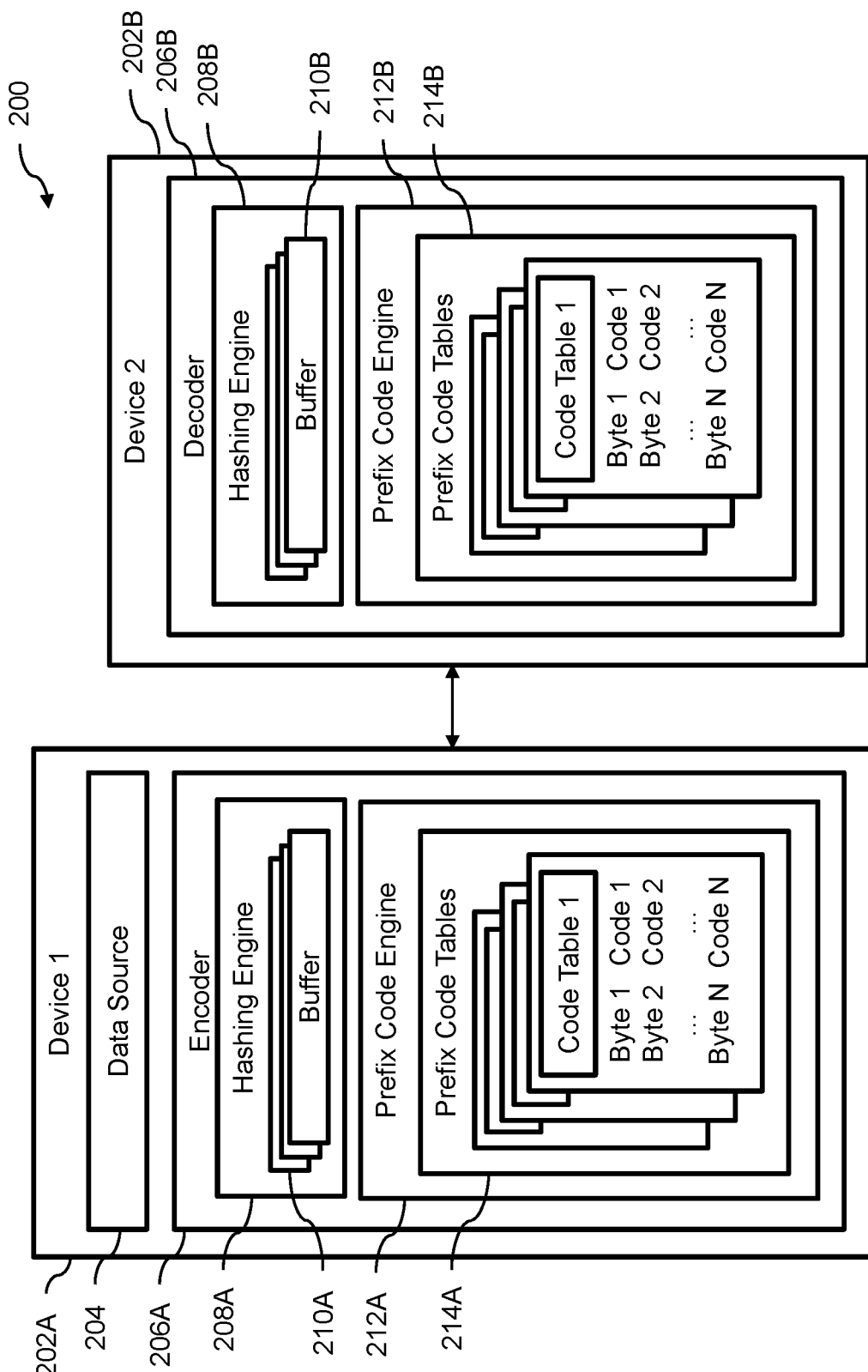
FIG. 2 is a block diagram of a system for stream-based compression, in accordance with an illustrative embodiment.

Referring now to FIG. 2, depicted is a system 200 for stream-based compression. The system 200 is shown to include a first device 202A and a second device 202B. Briefly, the first device 202B may include an encoder 206A. The encoder 206A may receive an input stream of bytes (e.g., from a data source 204). The input stream of bytes may include a first byte preceded by one or more second bytes. The encoder 206A may determine to identify a prefix code for the first byte. The encoder 206A may select a prefix code table using the one or more second bytes. The encoder 206A may maintain a plurality of prefix tables. Each prefix table may include respective prefix codes for respective bytes. Each prefix code may include a number of bits based on a frequency of occurrence of the second byte(s) preceding the respective byte. The encoder 206A may identify the prefix code of the first byte from the selected prefix code table. The encoder 206A may generate an output stream of bytes by replacing the first byte in the input stream with the prefix code of the first byte. The first device 202A may transmit the output stream from the encoder 206A of the first device 202A to a decoder 206B of a second device 202B. The output stream may have a fewer number of bits than the input stream.

The systems and methods of the present solution may be implemented in any type and form of device, including clients, servers and/or appliances described above with reference to FIG. 1. For instance, the first device 202A may be implemented at a server and the second device 202B may be implemented at a client device, or an intermediary device/appliance arranged between the server and the client device. The first device 202A may be in a handshake with the second device 202B. The first device 202A and second device 202B may include or incorporate components and devices similar in some aspects to those described above with reference to FIG. 1, such as a memory and/or one or more processors operatively coupled to the memory. The present systems and methods may be implemented in any embodiments or aspects of the appliances or devices described herein.

The first device 202A and second device 202B (collectively referred to as a device 202) may be embodied on, incorporated into, or otherwise be included in a client device associated with user(s). In some implementations, the device 202 may be or include an intermediary or other network device. In some implementations, the devices 202 may include, generate, access, or otherwise provide a data source 204. The data source 204 may be or include any type of data source such as, for instance, a file management system, an application or program, an operating system, or any other device or component configured to generate and deliver data to an external source. The first and second device 202 may both include respective data sources 204. In some implementations, the second device 202B may request data from the first device 202A (and/or vice versa). The first device 202A may include an encoder 206A, and the second device 202B may include a decoder 206B. The encoder 206A may function cooperatively with the decoder 206B. The encoder 206A may be configured to compress data to be delivered to the second device 202B (and correspondingly decompressed by the decoder 206B). As described in greater detail below, the encoder 206A may be configured to compress data using a hashing scheme and/or a prefix code scheme. In compressing a stream of bytes corresponding to data from the data source 204, the encoder 206A may conserve bandwidth and expedite delivery of content to other devices (such as the second device 202B).

In some implementations, the encoder 206A may be configured to compress a stream of bytes using a hashing scheme. The encoder 206A may include a hashing engine 208A. The hashing engine 208A may be any device, component, element, application, program, script, or circuitry designed or implemented to perform a hashing function for compression. The hashing engine 208A may be designed or implemented to maintain, include, or otherwise access one or more buffers 210A. The buffer(s) 210A may be or include bytes of data which were previously seen by the encoder 206A (e.g., within the input stream of bytes from the data source 204, for instance). The buffer(s) 210A may be circular buffers. In various embodiments, the hashing engine 208A may maintain a plurality of buffers 210A. For instance, the hashing engine 208A may maintain a first buffer 210A for a first number of bytes and a second buffer 210A for a second number of bytes. As described in greater detail below, by maintaining a plurality of buffers 210A, the hashing engine 208A may be configured to implement multiple stages of hashing and look-up functions for identifying potential matches of data in the buffer(s) 210A.

In some implementations, the buffer(s) 210A may be indexed by hash values. The hashing engine 208A may be configured to compute a hash value for an input (or target) byte to be compressed. In some implementations, the hashing engine 208A may be configured to compute the hash value for the input byte to be compressed using one or more preceding bytes. The hashing engine 208A may be configured to compute a first hash value H4 using a first number of preceding bytes (e.g., four preceding bytes, for instance). The hashing engine 208A may be configured to compute the first hash value H4 using equation 1 reproduced below:

$$H4 = (C\hat{\ }(C>>3)\hat{\ }(C>>13)) \& 0x3FFFF; \quad \text{Eq. 1}$$

where C is a 32-bit unsigned integer containing the previous four bytes of the input stream. The buffer 210A may include a plurality of hash values corresponding to previous sets of bytes (e.g., input bytes preceded by four bytes). The hashing engine 208A may be configured to perform a look-up function using the first hash value in the buffer 210A to determine whether a match is identified. The hashing engine 208A may be configured to identify the match based on a hash value in the buffer 210A being the same as the computed hash value (e.g., computed using equation 1).

In some implementations, where the hashing engine 208A does not identify a match in the buffer 210A, the hashing engine 208A may be configured to perform a second stage of hashing. The hashing engine 208A may be configured to perform the second stage of hashing where the hashing engine 208A does not identify a match in the buffer 210A during the first stage of hashing (e.g., using equation 1). The hashing engine 208A may be configured to perform the second stage of hashing using a fewer number of preceding bytes than the number of bytes used at the first stage of hashing. For instance, where the hashing engine 208A uses four bytes during the first stage of hashing, the hashing engine 208A may be configured to use fewer than four bytes during the second stage of hashing (e.g., three bytes, for example). The hashing engine 208A may be configured to compute a second hash value during the second stage of hashing. The hashing engine 208A may be configured to compute the second hash value using equation 2 reproduced below:

$$D = C>>8;$$

$$H_3 = (\hat{D}(D>>7)) \& 0x3FFF; \quad \text{Eq. 2}$$

where D is the preceding three bytes with respect to the input byte from the input stream.

Similar to the first stage of hashing, during the second stage of hashing, the hashing engine 208A may be configured to perform a look-up using the second hash value $H_3$ in a second buffer 210A. The second buffer 210A may be a buffer 210A indexed by hash values corresponding to the number of bytes used for computing the second hash value. Hence, the first buffer 210A may be indexed using a first number of bytes and the second buffer 210A may be indexed using a second number of bytes (e.g., fewer than the first number). The hashing engine 208A may similarly determine whether a match of the computed second hash value is present in the second buffer 210A. In some implementations, the hashing engine 208A may perform third, fourth, etc. stages of hashing and look-ups to identify matches of fewer bits. The hashing engine 208A may be designed or implemented to perform further stages of hashing depending on a balance between computational costs and bandwidth conservation.

In these and other implementations, where a match in one of the buffer(s) 210A is identified, the hashing engine 208A may be configured to identify a length of the match. The hashing engine 208A may be configured to identify the length of the match by computing hash values using the input byte and subsequent bytes (e.g., subsequent to the input byte) and performing look-up functions using the computed hash values in the corresponding buffer(s) 210A. The hashing engine 208A may be configured to identify the length of the match by comparing bytes corresponding to the hash value in the buffer 210A to the input stream of bytes. In either embodiment, the hashing engine 208A may be configured to identify the length of the match by determining a number of bytes of a series of bytes in the input stream that match a series of bytes in the buffer 210A. The hashing engine 208A may be configured to compare the input stream of bytes to bytes in the buffer 210A until a mismatch is identified (e.g., a byte in the series of bytes within the buffer 210A that does not match the input stream of bytes).

The hashing engine 208A may be configured to replace the matching bytes from the input stream of bytes with an identifier. The identifier may be a predefined, preset, or otherwise known byte (or number of bits) indicating that a match is present in the buffer 210A. As described in greater detail below, a decoder 206B on the second device 202B may be configured to detect, receive, or otherwise identify the identifier in the compressed stream of bytes and determine, based on the presence of the identifier in the compressed stream of bytes, that a matching number of bytes are included in the buffer 210B. The hashing engine 208A may be configured to include a length of the matching number of bytes. In some implementations, the hashing engine 208A may encode the length of the matching number of bytes using a prefix code (such as a Huffman code). In some implementations, the hashing engine 208A may be configured to limit the maximum length (e.g., the length of the matching number of bytes may be bounded). The hashing engine 208A may be configured to limit the length of the matching number of bytes to a maximum number which may be encoded in a prefix code. For instance, where the prefix code is four bits, the maximum length may be 15 matching bytes, where the prefix code is eight bits, the maximum length may be 256 matching bytes, etc.

The encoder 206A may include a prefix code engine 212A. The prefix code engine 212A may be any device, component, element, application, program, script, or circuitry designed or implemented to perform prefix code generation and replacement for compression of input bytes for an input stream. A prefix code, as used herein, refers to a code which corresponds to a byte. Each prefix code may include a number of bits. The number of bits for a respective byte may change based on the frequency of use of the corresponding byte. For instance, bytes which are used more frequently may have prefix codes with fewer bits than bytes which are used more infrequently. Each prefix code may be a context-based prefix code generated based on or using entropy encoding schemes. For instance, the prefix code for a particular byte may be determined, assigned, or otherwise be generated for the byte based on a context of the byte. In some implementations, the prefix code may be a Huffman code. In other implementations, the prefix code may be another type of prefix code, such as an arithmetic code.

Figure 3:
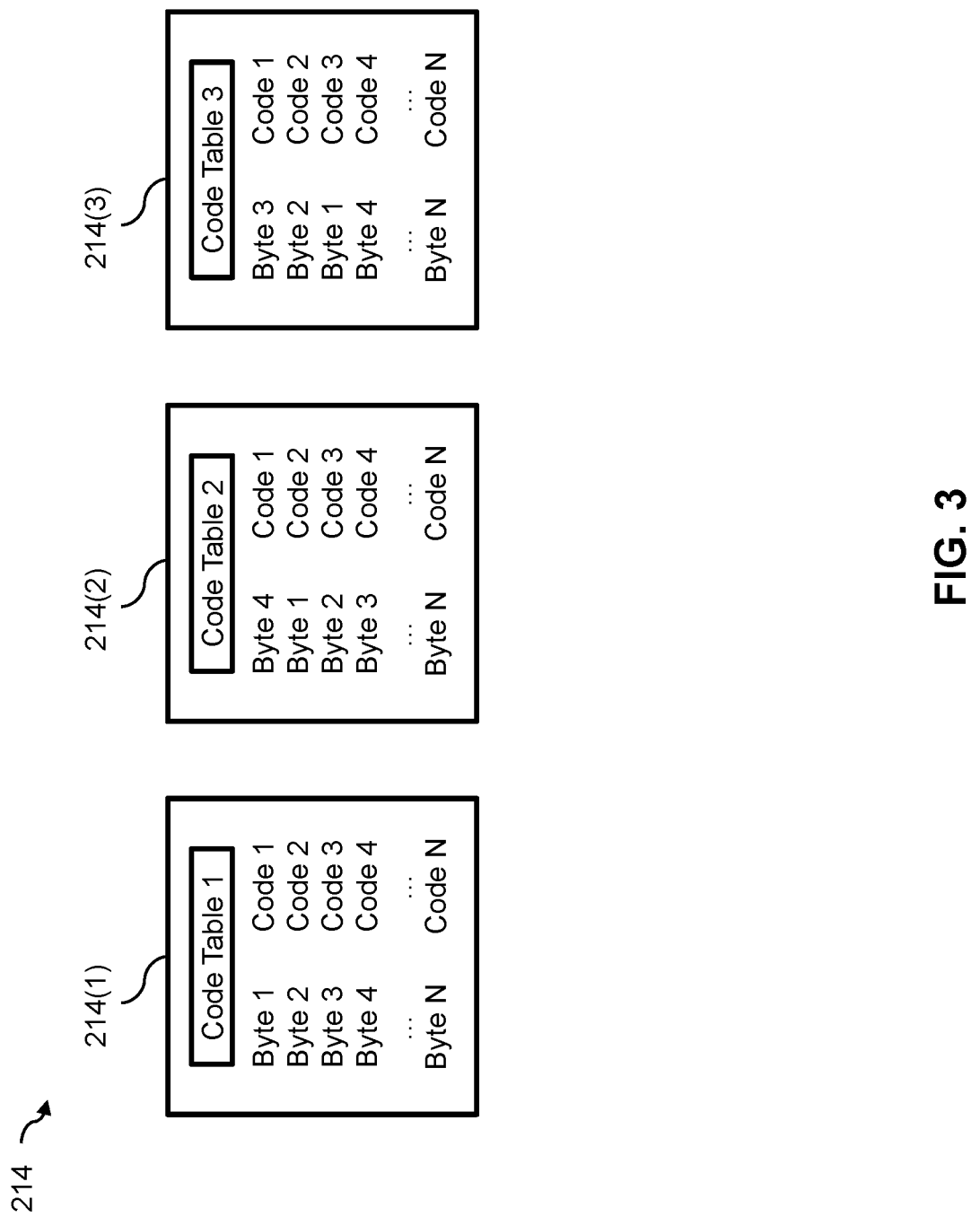
FIG. 3 shows a plurality of prefix code tables which may be used in the system of FIG. 2, in accordance with an illustrative embodiment.

Referring to FIG. 2 and FIG. 3, the prefix code engine 212A may be designed or implemented to maintain a plurality of prefix code tables 214A. Specifically, FIG. 3 depicts a plurality of prefix code tables 214A. As shown, at least some of the bytes may have different prefix codes in different prefix code tables 214A. For instance, byte 1 has prefix code 1 in the first prefix code table 214(1), prefix code 2 in the second prefix code table 214(2), and prefix code 4 in the third prefix code table 214(3). Similarly, byte 4 has prefix code 4 in the first prefix code table 214(1), prefix code 1 in the second prefix code table 214(2), and prefix code 3 in the third prefix code table 214(3). While three prefix code tables 214 are shown for simplicity purposes, it is noted that the prefix code engine 212A may be configured to maintain any number of prefix code tables 214A. Each prefix code table 214A may be context-specific. For instance, a first prefix code table 214A may have prefix codes for bytes in a first context, a second prefix code table 214A may have prefix code for the same bytes in a second context, and so forth. The context may be determined or identified for a target byte (e.g., a byte to be encoded with a prefix code). The context may be determined based on one or more preceding bytes (e.g., bytes that precede the target byte in the input stream), one or more subsequent bytes (e.g., bytes that follow the target byte in the input stream), and so forth.

Each prefix code table 214A may be indexed by one or more bytes. For instance, each prefix code table 214A may by indexed by one or more bytes, with the prefix code for a respective byte in the prefix code table 214A being determined based on the likelihood, frequency, or probability of the target byte following the one or more bytes. As one example, the prefix code engine 212A may be configured to maintain a number of prefix code tables 214A corresponding to a number of available ASCII characters. Each prefix code table 214A may be indexed by a byte corresponding to an ASCII character. The prefix codes for bytes within a respective prefix code table 214A may be generated based on the likelihood of the byte following the ASCII character by which the prefix code table 214A is indexed. As a simple example, the prefix code table 214A indexed by the ASCII character "Q" may have a prefix code for a byte corresponding to "U." The prefix code for the byte corresponding to "U" may have fewer bits, as it is more likely that the ASCII character "U" follows the ASCII character "Q."

The prefix code engine 212A may be designed or implemented to perform a look-up function using one or more other bytes of the input stream for identifying or selecting a prefix code table 214A (e.g., from the plurality of prefix code tables 214A). The prefix code engine 212A may be configured to use a number of preceding bytes (e.g., preceding a target byte of the input stream to be encoded) for performing the look-up function. As such, the prefix code engine 212A may be configured to use the preceding byte(s) as context for selecting a prefix code table 214A and identifying a prefix code for the target byte of the input stream. The prefix code engine 212A may be configured to select, from the plurality of prefix code tables 214A, a prefix code table for which to identify a prefix code for a target byte.

The prefix code engine 212A may be configured to select a prefix code from the selected prefix code table 214A corresponding to a target byte from the input stream of bytes. The prefix code engine 212A may be configured to select a prefix code from the prefix code table 214A by performing a look-up function using the target byte in the prefix code table 214A. The prefix code engine 212A may be configured to identify the prefix code corresponding to the target byte in the prefix code table 214A. The prefix code engine 212A may be configured to generate an output stream of bytes (e.g., a compressed stream of bytes) by replacing the target byte with the corresponding prefix code from the prefix code table 214A. The prefix code engine 212A may be configured to increase a count of the prefix code in the prefix code table 214A (e.g., from n to n+1).

In each of these embodiments, the encoder 206A may be configured to generate an output stream of bytes (e.g., a compressed stream of bytes) by replacing bytes with 1) identifiers and lengths corresponding to matching bytes in the buffer(s) 210A, or 2) prefix codes in a context-based prefix code table 214A. The encoder 206A may be configured to transmit the output stream of bytes to the second device 202B for the decoder 206B to decompress the output stream of bytes, as described in greater detail below.

In some implementations, the prefix code engine 212A may be designed or implemented to update the prefix code tables 214A. The prefix code engine 212A may be configured to update the prefix code tables 214A at various intervals (e.g., following a certain duration of time, following encoding of a certain number of bytes, etc.). As described above, when the prefix code engine 212A replaces a byte with a prefix code from a prefix code table 214A, the prefix code engine 212A may be configured to increase a count for the prefix code. As such, over time, the prefix code engine 212A may be configured to determine a frequency of use of each of the prefix codes in each of the respective prefix code tables 214A. The prefix code engine 212A may generate new prefix code tables 214A (or update, modify, or revise the existing prefix code tables 214A) such that the more frequently used bytes in a respective prefix code table 214 have prefix codes with fewer bits. As such, compression may be optimized and improved over time.

As shown in FIG. 2, the second device 202B may include a decoder 206B. The decoder 206B may be similar in some respects to the encoder 206A of the first device 202A. The decoder 206B may include a hashing engine 208B and a prefix code engine 212B. The hashing engine 208B may be configured to maintain buffers 210B similar to the buffers 210A. The hashing engine 208B may be configured to update the buffer 210B as a compressed stream of bytes is received from the first device 202A. Hence, the buffers 210B may substantially mirror the buffers 210A of the first device 202A. Similarly, the prefix code engine 212B may be configured to maintain prefix code tables 214B. The prefix code engine 212B may be configured to update the prefix code tables 214B as the prefix code engine 212B decodes, deciphers, or otherwise decompresses the compressed stream of bytes. As such, the prefix code tables 214B may substantially mirror the prefix code tables 214B of the first device 202A.

In operation, the second device 202B may be configured to receive a compressed stream of bytes from the first device 202B (e.g., across a network, such as one of the networks described above with reference to FIG. 1). The second device 202B may be configured to route the compressed stream of bytes to the decoder 206B. The decoder 206B may be configured to decompress the compressed stream of bytes in series by first determining whether the compressed stream of bytes includes an identifier and a length (e.g., indicating a match is present in the buffer 210B). As the decoder 206B receives the compressed stream of bytes, and the decoder 206B determines the compressed stream of bytes includes an identifier, the hashing engine 208B may be configured to compute a hash value (e.g., using other bytes from the compressed stream according to equation 1), and perform the look-up using the hash value in the first buffer 210B to identify the matching bytes. Where the hashing engine 208B does not identify a matching hash value in the first buffer 210B, the hashing engine 208B may be configured to compute a hash value (using less bytes from the compressed stream according to equation 2), and perform the look-up using the hash value in the second buffer 210B. The hashing engine 208B may be configured to decompress the compressed stream of bytes by replacing the identifier with the number of bytes corresponding to the length.

As the decoder 206B receives the compressed stream of bytes, and the decoder 206B determines the compressed stream of bytes does not include an identifier, the prefix code engine 212B may be configured to identify a prefix code in the compressed stream. The prefix code engine 212B may be configured to identify the corresponding prefix code table 214B using one or more other bytes of the compressed stream of bytes (similar to the method by which the prefix code engine 212A of the first device 202A identifies a prefix code table 214A). The prefix code engine 212B may be configured to use the prefix code from the compressed stream for performing a look-up in the prefix code table 214B for identifying the corresponding byte. The prefix code engine 212B may be configured to decompress the compressed stream of bytes by replacing the prefix code with the corresponding byte from the selected prefix code table 214A. The prefix code engine 212B may increase the count for the prefix code in the prefix code table 214B and, at various intervals as described above, update the prefix code tables 214B such that the prefix code tables 214A, 214B substantially mirror one another.

According to the embodiments described herein, the compression scheme (e.g., using a combination of the hashing engine 208A and the prefix code engine 212A) yields improvements on general file compression—particularly where low computational cost is imperative. Using a static file compression test (of a 500 MB XML file) the system described herein yielded a compression file size of 51.1 MB, which was less than other commonly available compression utilities including (7ZIP [55.2 MB], WINDOWS compressed folder [60.1 MB], and WinRAR [63.0 MB]), and compressed the file in a time taken [4.7 s] which was less than the other commonly available compression utilities (7ZIP [11.5 s], WINDOWS compressed folder [10.4 s], and WinRAR [9.2 s]). As such, the system described herein improves on existing compression utilities both in speed and compression ratio. Further, as computation cost is relatively low, performance is not impacted within various computing environments, such as remote delivery sessions.

Figure 4:
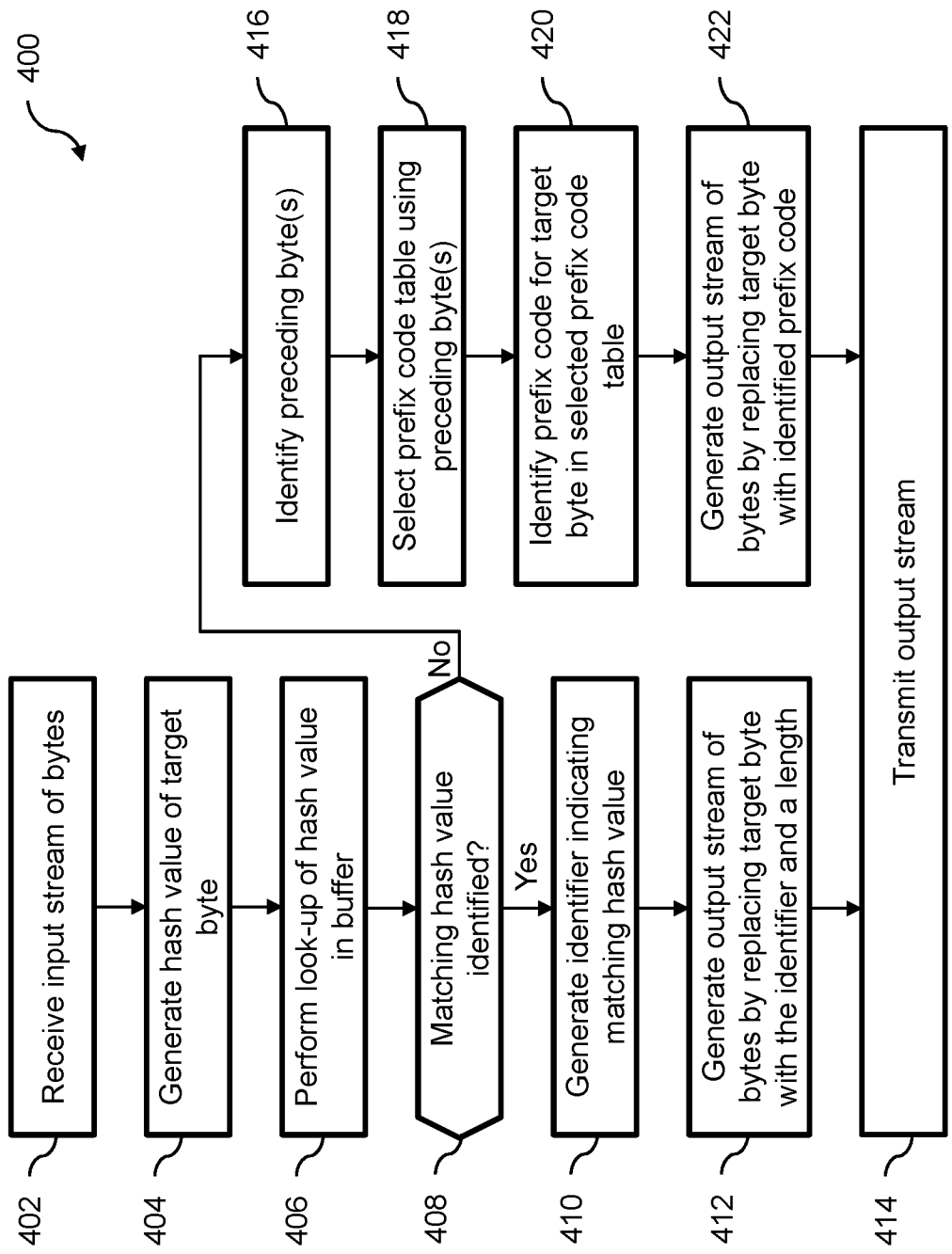
FIG. 4 is a flow chart showing a method for stream-based compression, in accordance with an illustrative embodiment.

Referring now to FIG. 4, an implementation of a method 400 for stream-based compression will be described. In brief overview of method 400, at step 402, an encoder receives an input stream of bytes. At step 404, the encoder generates a hash value of a target byte. At step 406, the encoder performs a look-up of the hash value in a buffer. At step 408, the encoder determines whether the hash value matches a hash in the buffer. Where a match is present, the method 400 proceeds to step 410. At step 410, the encoder generates an identifier indicating the presence of a match. At step 412, the encoder generates an output stream of bytes by replacing the target byte with the identifier and a length. Where, at step 408, a match is not present, the method 400 proceeds to step 416. At step 416, the encoder identifies one or more preceding bytes. At step 418, the encoder selects a prefix code table using the preceding byte(s). At step 420, the encoder identifies a prefix code for the target byte in the selected prefix code table. At step 422, the encoder generates an output stream of bytes by replacing the target byte with the prefix code. At step 424, the first device transmits the output stream of bytes.

At step 402, an encoder receives an input stream of bytes. In some embodiments, an encoder of a first device may receive an input stream of bytes including a first byte preceded by one or more second bytes. The encoder may receive the input stream of bytes from a data source. The data source may be local (e.g., to the first device). The encoder may receive the input stream of bytes responsive to the first device receiving a request for the data from a second device (e.g., located remotely from the first device). The first device may provide the input stream of bytes to the encoder for compression. As described in greater detail below, the encoder may compress the input stream of bytes to generate an output stream of bytes for transmission to the second device.

At step 404, the encoder generates a hash value of a target byte. In some embodiments, the encoder may generate a hash value from the input stream. The encoder may generate the hash value using, including, or otherwise based on the target byte (e.g., a first byte) and a number of preceding bytes. The encoder may generate the hash value according to equation 1. In some embodiments, the encoder may generate a string including the target byte and a plurality of preceding bytes (e.g., four preceding bytes). The encoder may compute a hash value for the string (e.g., according to equation 1).

At step 406, the encoder performs a look-up of the hash value in a buffer. The encoder may maintain, include, or otherwise access a buffer. The buffer may be a history buffer. The encoder may perform a look-up (e.g., using the generated hash value at step 404) of the hash value in the buffer. In some embodiments, the encoder may maintain a plurality of buffers for different sized hash values (e.g., hash values computed using a different number of bytes). For instance, the encoder may maintain a first buffer for a first number of bytes and a second buffer for a second number of bytes. The encoder may perform the look-up of the hash value in the corresponding buffer. Where a match is not present in the first buffer, the encoder may compute a second hash value using second string generated with the target byte and a second number of preceding bytes fewer than the number of bytes used at step 404. The encoder may compute the second hash value using the target byte and a fewer number of preceding bytes (e.g., three preceding bytes) according to equation 2. The encoder may perform a look-up of the second hash value in the second buffer.

At step 408, the encoder determines whether the hash value matches a hash in the buffer. In some embodiments, the encoder may determine whether the generated first or second hash value matches a hash value in one of the buffers. Where a match is present, the method 400 proceeds to step 410. At step 410, the encoder generates an identifier indicating the presence of a match. In some embodiments, responsive to identifying the matching hash value in the (first or second) buffer, the encoder may generate an identifier indicating a presence of the matching hash value within the buffer. The identifier may signal the presence of a matching hash value in the buffer.

At step 412, the encoder generates an output stream of bytes by replacing the target byte with the identifier and a length. In some embodiments, the encoder may generate the output stream of bytes by replacing the target byte and the number of preceding bytes (e.g., which match the bytes in the buffer) in the input stream with the identifier and a length. The length may indicate the number of matching bytes in the input stream which match a series of bytes in the buffer. In some implementations, the length may be limited to a length of a maximum number of bits of the respective prefix codes for the plurality of prefix code tables. Each prefix code may include a maximum number of bits. The length of the match may be limited to the maximum number of bits of a prefix code. In some embodiments, the encoder may maintain a length prefix code table. Similar to the prefix code tables described above, each prefix code table may include a prefix code corresponding to a byte. The length prefix code table may include prefix codes corresponding to bytes which encode a length. The encoder may perform a look-up of the length of the match in the length prefix code table to identify a prefix code corresponding to the length of the match. The encoder may generate the compressed stream of bytes by replacing the matching bytes with the generated identifier (e.g., at step 410) and the prefix code corresponding to the length of the matching bytes.

Where, at step 408, a match is not present in the buffer(s), the method 400 proceeds to step 416. In this regard, the encoder may determine to identify a prefix code for a target byte. The encoder may determine to identify the prefix code for the first byte by determining that the buffer does not include a matching hash value. At step 416, the encoder identifies one or more preceding bytes. In some embodiments, the encoder may identify a plurality of preceding bytes. The encoder may use the preceding byte(s) as context for selecting a prefix code table, as described in greater detail below.

At step 418, the encoder selects a prefix code table using the preceding byte(s). In some embodiments, the encoder selects, from a plurality of prefix code tables maintained by the encoder, a prefix code table using the one or more preceding bytes. Each prefix code table of the plurality of prefix code tables may include respective prefix codes for respective bytes. In some embodiments, each prefix code table may be indexed by one or more respective bytes. Each prefix code may include a number of bits based on a frequency of occurrence of the one or more second bytes preceding the respective byte. For instance, a prefix code for a target byte in a prefix code table indexed by a first byte may have fewer bits if that target byte frequently follows the first byte. Similarly, a prefix code for a target byte in a prefix code table indexed by a second byte may have a greater number of bits if that target byte infrequently follows the second byte. Hence, a target byte may have different prefix codes in different prefix code tables. In some embodiments, the encoder may maintain a prefix code table for each possible input byte. As a simple example, the encoder may maintain a prefix code table for each ASCII character which may be included in an input stream of bytes. The encoder may select the prefix code table by performing a look-up of the plurality of prefix code tables using the one or more second bytes (e.g., that precede the target byte).

At step 420, the encoder identifies a prefix code for the target byte in the selected prefix code table. In some embodiments, the encoder identifies the prefix code for the target byte in the selected prefix table (e.g., at step 418). The encoder may perform a look-up using the target byte in the selected prefix code table. The encoder may identify the prefix code that corresponds to the target byte. In some embodiments, responsive to identifying the prefix code, the encoder may increase a count of the prefix code (or the target byte). The encoder may use the count of the prefix code for updating the prefix code tables, as described in greater detail below.

At step 422, the encoder generates an output stream of bytes by replacing the target byte with the prefix code. In some embodiments, the encoder may generate the output stream of bytes by replacing the target byte in the input stream with the prefix code of the target byte (e.g., identified at step 420). At step 424, the first device transmits the output stream of bytes. The first device may transmit the output stream of bytes to the second device. The first device may transmit the output stream from the encoder of the first device to a decoder of a second device. The output stream may have fewer bits than the input stream. The output stream may have fewer bits than the input stream as a result of the replacement of bytes with identifiers and lengths (e.g., at step 412) and prefix codes (e.g., at step 420). The decoder may decode the output stream using a plurality of prefix code tables corresponding to the prefix code tables maintained by the encoder. The decoder may maintain a plurality of prefix code tables which substantially mirror the prefix code tables maintained by the encoder. Similarly, the decoder may maintain one or more buffers which substantially mirror the buffer(s) maintained by the encoder.

In some embodiments, the decoder may receive the output stream from the encoder. The output stream may include at least one prefix code. The decoder may identify the prefix code in the output stream. The decoder may identify at least one preceding byte which precedes the prefix code. The decoder may select a prefix code table corresponding to the at least one preceding byte (e.g., similar to step 418). The decoder may identify an input byte corresponding to the prefix code by performing a look-up of the prefix code in the selected prefix code table. The decoder may reproduce the input stream by replacing the prefix code in the output stream with the input byte from the prefix code table. Similarly, the decoder may determine that the input stream includes an identifier (and a length, or a prefix code corresponding to a length). The decoder may compute a hash value using a plurality of preceding bytes (similar to the hash value computed at step 404). The decoder may perform a look-up of the hash value in the buffer(s) maintained by the decoder. The decoder may reproduce the input stream by replacing the identifier with the matching bytes from the buffer.

In some embodiments, the encoder and decoder may update the prefix code tables. As such, the prefix code tables may be a first set of prefix code tables generated based on or using a first input stream of bytes. The encoder may receive a second input stream including a plurality of second bytes.

The encoder may identify a respective prefix code table using at least one preceding byte from the second input stream which precedes the second byte. The encoder may identify a prefix code corresponding to the second byte (e.g., from the respective prefix code table). The encoder may update a count of the prefix code corresponding to the second byte. As the encoder updates the count over time, the encoder may generate a second plurality of prefix code tables. The encoder may generate the second plurality of prefix code tables based on the count of each respective prefix code in each respective prefix code table in the first plurality of prefix code tables. As such, the prefix codes may be updated to reflect the frequency of use of the corresponding bytes in the input stream.

Similarly, the decoder may maintain the first plurality of prefix code tables. The decoder may receive a second output stream (e.g., including a plurality of prefix codes) corresponding to the second input stream. For each prefix code, the decoder may identify a corresponding input byte within a prefix code table corresponding to a preceding byte (e.g., a byte which precedes the prefix code). The decoder may update a count corresponding to the input byte within the prefix code table. The decoder may generate a second plurality of prefix code tables over time (e.g., at substantially the same time as the encoder) such that the prefix code tables maintained by the encoder and decoder mirror one another. The decoder may generate the second plurality of prefix code tables based on the count of each respective input byte in each respective prefix code table in the first plurality of prefix code tables.

Various elements, which are described herein in the context of one or more embodiments, may be provided separately or in any suitable subcombination. For example, the processes described herein may be implemented in hardware, software, or a combination thereof. Further, the processes described herein are not limited to the specific embodiments described. For example, the processes described herein are not limited to the specific processing order described herein and, rather, process blocks may be re-ordered, combined, removed, or performed in parallel or in serial, as necessary, to achieve the results set forth herein.

It will be further understood that various changes in the details, materials, and arrangements of the parts that have been described and illustrated herein may be made by those skilled in the art without departing from the scope of the following claims.

I claim:

1. A method, comprising:
receiving, by a first computing system, a plurality of bytes of an input stream;
determining, by the first computing system, that a target byte in the input stream is to be encoded with a prefix code;
identifying, by the first computing system, at least a first contextual byte that occupies a particular position relative to the target byte in the input stream;
selecting, by the first computing system, a first prefix code table from among a plurality of prefix code tables based at least in part on the first contextual byte that occupies the particular position, the plurality of prefix code tables including at least the first prefix code table and a second prefix code table, wherein the first prefix code table includes a first prefix code for the target byte and the second prefix code table includes a second prefix code for the target byte, the first prefix code including a different number of bits than the second prefix code; and
using, by the first computing system, the first prefix code from the first prefix code table to encode the target byte in the plurality of bytes to reduce a number of bits of the input stream for transmission as an output stream.

2. The method of claim 1, further comprising:
transmitting, by the first computing system, the output stream to a second computing system.

3. The method of claim 1, further comprising:
replacing, by the first computing system, the target byte with the first prefix code.

4. The method of claim 1, further comprising:
generating, by the first computing system, the output stream to comprise the target byte replaced by the first prefix code.

5. The method of claim 1, wherein selecting the first prefix code table from among the plurality of prefix code tables comprises determining that the first prefix code table is indexed by the first contextual byte.

6. The method of claim 1, wherein:
the first prefix code includes a first number of bits corresponding to a first likelihood of the target byte occupying the particular position relative to the first contextual byte; and
the second prefix code includes a second number of bits corresponding to a second likelihood of the target byte occupying the particular position relative to a different contextual byte.

7. The method of claim 1, wherein:
the plurality of prefix code tables comprises different prefix code tables for respective contextual bytes that could possibly occupy the particular position relative to the target byte.

8. A first computing system, comprising:
at least one processor; and
at least one computer readable medium encoded with instructions which, when executed by the at least one processor, cause the first computing system to:
receive a plurality of bytes of an input stream,
determine that a target byte in the input stream is to be encoded with a prefix code,
identify at least a first contextual byte that occupies a particular position relative to the target byte in the input stream,
select a first prefix code table from among a plurality of prefix code tables based at least in part on the first contextual byte that occupies the particular position, the plurality of prefix code tables including at least the first prefix code table and a second prefix code table, wherein the first prefix code table includes a first prefix code for the target byte and the second prefix code table includes a second prefix code for the target byte, the first prefix code including a different number of bits than the second prefix code, and
use the first prefix code from the first prefix code table to encode the target byte in the plurality of bytes to reduce a number of bits of the input stream for transmission as an output stream.

9. The first computing system of claim 8, wherein the at least one computer readable medium is further encoded with additional instructions which, when executed by the at least one processor, further cause the first computing system to:
transmit the output stream to a second computing system.

10. The first computing system of claim 8, wherein the at least one computer readable medium is further encoded with additional instructions which, when executed by the at least one processor, further cause the first computing system to:
replace target byte with the first prefix code.

11. The first computing system of claim 8, wherein the at least one computer readable medium is further encoded with additional instructions which, when executed by the at least one processor, further cause the first computing system to:
generate the output stream to comprise the target byte replaced by the first prefix code.

12. The first computing system of claim 8, wherein the at least one computer readable medium is further encoded with additional instructions which, when executed by the at least one processor, further cause the first computing system to:
select the first prefix code table from among the plurality of prefix code tables at least in part by determining that the first prefix code table is indexed by the first contextual byte.

13. The first computing system of claim 8, wherein:
the first prefix code includes a first number of bits corresponding to a first likelihood of the target byte occupying the particular position relative to the first contextual byte; and
the second prefix code includes a second number of bits corresponding to a second likelihood of the target byte occupying the particular position relative to a different contextual byte.

14. The first computing system of claim 8, wherein:
the plurality of prefix code tables comprises different prefix code tables for respective contextual bytes that could possibly occupy the particular position relative to the target byte.

15. At least one non-transitory computer readable medium encoded with instructions which, when executed by at least one processor of a first computing system, cause the first computing system to:
receive a plurality of bytes of an input stream;
determine that a target byte in the input stream is to be encoded with a prefix code;
identify at least a first contextual byte that occupies a particular position relative to the target byte in the input stream;
select a first prefix code table from among a plurality of prefix code tables based at least in part on first contextual byte that occupies the particular position, the plurality of prefix code tables including at least the first prefix code table and a second prefix code table, wherein the first prefix code table includes a first prefix code for the target byte and the second prefix code table includes a second prefix code for the target byte, the first prefix code including a different number of bits than the second prefix code; and
use the prefix code to encode the target byte in the plurality of bytes to reduce a number of bits of the input stream for transmission as an output stream.

16. The at least one non-transitory computer readable medium of claim 15, encoded with additional instructions which, when executed by the at least one processor, further cause the first computing system to:
transmit the output stream to a second computing system.

17. The at least one non-transitory computer readable medium of claim of claim 15, wherein:
the first prefix code includes a first number of bits corresponding to a first likelihood of the target byte occupying the particular position relative to the first contextual byte; and
the second prefix code includes a second number of bits corresponding to a second likelihood of the target byte occupying the particular position relative to a different contextual byte.

18. The at least one non-transitory computer readable medium of claim 15, encoded with additional instructions which, when executed by the at least one processor, further cause the first computing system to:
generate the output stream to comprise the target byte replaced by the first prefix code.

19. The at least one non-transitory computer readable medium of claim 15, encoded with additional instructions which, when executed by the at least one processor, further cause the first computing system to:
select the first prefix code table from among the plurality of prefix code tables at least in part by determining that the first prefix code table is indexed by the first contextual byte.

20. The at least one non-transitory computer readable medium of claim of claim 15, wherein:
the plurality of prefix code tables comprises different prefix code tables for respective contextual bytes that could possibly occupy the particular position relative to the target byte.

* * * * *